June 20, 1961 S. H. BARNES ET AL 2,989,671

VOLTAGE SENSITIVE SEMICONDUCTOR CAPACITOR

Filed May 23, 1958

SANFORD H. BARNES,
JOHN E. MANN,
INVENTORS.

BY

Spensley and Horn

ATTORNEYS.

United States Patent Office 2,989,671

Patented June 20, 1961

2,989,671

VOLTAGE SENSITIVE SEMICONDUCTOR CAPACITOR

Sanford H. Barnes, Sherman Oaks, and John E. Mann, Pasadena, Calif., assignors to Pacific Semiconductors, Inc., Culver City, Calif., a corporation of Delaware Filed May 23, 1958, Ser. No. 737,354
10 Claims. (Cl. 317—242)

This invention relates to semiconductor devices and to a method of manufacturing such devices. More particularly, this invention relates to semiconductor devices suitable for use as high Q voltage sensitive variable capacitors and to a method for producing such devices having controlled and reproducible operating characteristics.

Non-linear or voltage sensitive variable capacitors are used in a wide variety of applications. Such capacitors afford a means of varying circuit capacitance by control of applied bias voltage and are especially useful in circuits for voltage tuning, frequency modulation, automatic frequency control, and the like. In these and other applications of such devices it is important that the device have a high Q or quality factor and that the bias voltage versus capacitance characteristics of the device be controlled in manufacture to within specified ranges of tolerance.

The difficulty of achievement of these controlled and reproducible characteristic tolerances in suitably high Q devices has in the past rendered it commercially impractical to use semiconductor devices, such as a fused junction silicon diode, as a voltage sensitive variable capacitor although such semiconductor devices were broadly known to have non-linear capacitance properties.

It will, of course, be understood that by the term "fused junction" is meant a junction produced by disposing a specimen of active impurity of a first conductivity determining type adjacent to the surface of a semiconductor crystal such as silicon which is of the opposite conductivity type and heating the crystal to alloy therein impurities from atoms of the specimen to convert the semiconductor material of the crystal by doping the adjacent region with atoms of the active impurity from the specimen thereby changing this adjacent region to the opposite conductivity type. It will further be understood that by the term "Q" or "Q factor" is meant the ratio of the energy stored to the energy lost in the device. The term "Q" or "quality factor" may also be equivalently defined as the ratio of electrical reactance to resistance of the device.

A silicon semiconductor junction diode when biased in the reverse direction exhibits variable capacity characteristics. For the fused junction type of device, the capacitance of the device varies as the inverse square root of the applied reverse bias voltage. The capacitance versus voltage relationship can, however, be made to obey laws or modes of variations other than that of the inverse square root law by using methods of junction fabrication other than fusion. In a given fused junction device, the junction capacitance is furthermore essentially independent of the frequency of the applied alternating current signal, being determined solely by the applied bias voltage. The capacitance also remains substantially constant over a wide range of ambient temperature variations.

A silicon semiconductor junction diode, when biased in the reverse direction, appears to small A.-C. signals essentially as a resistance and a capacitance in series. The value of these equivalent circuit parameters for a given device, is determined by the amplitude of the applied D.-C. bias. The Q of such a device may be determined by the formula $Q=X_c/R_s$ where $X_c$ is the capacitive reactance of the device and $R_s$ is the equivalent series resistance of the device. It follows that $Q=\frac{1}{2}\pi FR_sC_s$ where F is the frequency of the applied signal and where $C_s$ is the equivalent series capacitance.

These parameters of the device are in turn, of course, determined by the material from which the device is made, the geometry of the device, and the mode of manufacture of the device. In the manufacture of such devices, it is, for example, necessary to secure an ohmic or back contact to the diode. The manner in which this is done will affect the characteristics and properties of the device.

It has in the past been difficult to produce reliable semiconductor devices having characteristics rendering the device suitable for use as a voltage sensitive variable capacitor in such a manner that these characteristics can be controlled in manufacture to within specified tolerances so as to produce reliable devices on a commercially feasible basis. It has further been difficult to produce such devices having a sufficiently high Q or quality factor to render them practicably useful.

It is therefore an object of this invention to provide a semiconductor voltage sensitive crystal capacitor of improved reliability and performance characteristics.

It is a further object of this invention to provide a fused junction silicon semiconductor diode suitable for use as a voltage sensitive crystal capacitor.

It is a further object of the present invention to provide a semiconductor voltage sensitive capacitor having a higher Q than has heretofore been obtainable.

It is a still further object of the present invention to provide an improved method for producing such devices.

It is a more specific object of the present invention to provide an improved method for producing the ohmic or back contact for semiconductor devices such as voltage sensitive crystal capacitors.

While the novel and distinctive features of the invention are particularly pointed out in the appended claims, a more expository treatment of the invention, in principle and in detail, together with additional objects and advantages thereof, is afforded by the following description and accompanying drawings in which like reference characters are used to refer to like parts throughout and wherein:

Figure 1:
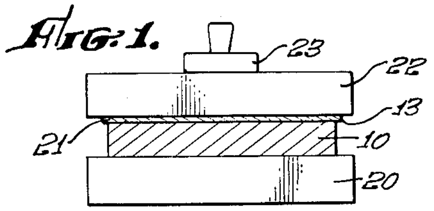
FIGURE 1 is an elevational view illustrating the manner in which an ohmic or back contact may be made to a silicon wafer as a first step in the production of a semiconductor voltage sensitive capacitor in accordance with the present invention.
Figure 4:
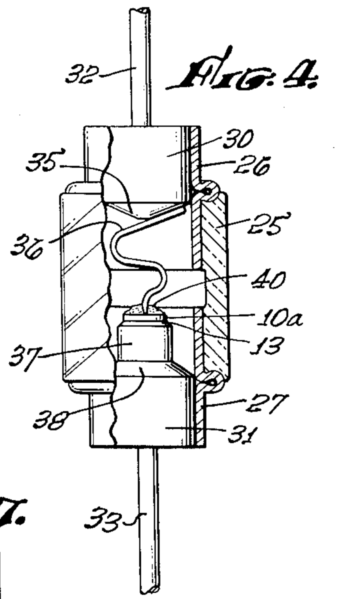
FIGURE 4 is a perspective view, partly cut away, showing a completed voltage sensitive silicon capacitor produced in accordance with the present invention and mounted in an hermetically sealed package.

Turning now to the drawings and in particular to FIGURE 1, there is shown a wafer 10 which is preferably a silicon wafer of a diameter of approximately 1½ inches sliced from a single silicon crystal. After an ohmic contact has been made to the wafer 10, by means to be explained in detail below, the wafer is diced into small individual units such as shown at 10*a* in FIGURE 2. A fused junction is then formed in each of these units 10*a* by means which will also be described in detail below, and they are then shaped and assembled into the completed device as shown in FIGURE 4.

In a preferred embodiment of the invention the wafer 10 from which the main body portion 10*a* is cut is preferably silicon prepared to be of N type conductivity. As noted above, the material used to form the body 10*a* should also preferably be single crystal material and have a resistivity in the range from 0.1 to 1.5 ohm-centimeters in order to optimize the quality of the completed device. It has been found that such a crystal resistivity permits the production on a high quality yield basis of reliable voltage sensitive silicon capacitors when taken in conjunction with other factors to be described below.

As was noted in the discussion above, the Q of devices of this type may be expressed by the formula $$Q=\frac{1}{2}\pi F R_s C_s$$

It will be apparent from this formula that the Q or quality factor of such a device may be increased by decreasing either the series capacitance or the series resistance of the device. It will also be recalled, however, that an object of the invention is to provide a device having a predetermined capacitance at a given applied bias voltage. Therefore, from a practical point of view, a useful increase in the Q of the device is necessarily achieved by a reduction in the series resistance of the device. This series resistance is determined not only by the above noted resistivity of the material from which the device is fabricated, but also by the manner in which an ohmic contact is made to the device.

In fact, in order to produce reliable devices while reducing the series resistance and hence increasing the Q, it has been found that the manner of making the ohmic or back contact to the base is of critical importance. Known prior art methods for producing such ohmic or back contacts frequently result in cracks, unwet areas, and variable contact thickness which result in a higher series resistance for the completed device than is achieved in devices made in accordance with the present invention. Furthermore, these undesirable properties result in uncontrollable base thickness which in turn results in variable D.-C. characteristics of the device.

In accordance with the present invention an improved method for producing the back contact involves the following procedure. The silicon wafer 10 shown in FIGURE 1 is, as noted above, sliced from a single silicon crystal and is preferably of a diameter of approximately 1½ inches. The wafer is then lapped and etched in accordance with well known prior techniques to remove saw damage and to reduce the wafer thickness to the approximate desired thickness of 15 mils and also to clean the surface.

At this point, a new step is employed which offers considerable improvement over known methods. The surface 13 of the wafer 10 on which ohmic or back contact is to be made is wet-lapped with a 600 mesh abrasive to roughen the etched surface. This step, together with others hereinafter to be described, results in a much more even distribution of an alloyed foil after fusion thereof to make the ohmic contact because of greater wetting action which reduces the propensity for the appearance of cracks which result from variations in the thickness of the alloyed back contact region.

After lapping, the wafer is placed upon a sheet of foil which consists of 99% gold and 1% antimony. Since each wafer varies in size, the foil is cut in accordance with the size of the wafer with which it is to be used. A slight overlap of the foil relative to the wafer is provided. The thickness of the foil has been found to be extremely critical. It was found that the foil must be held to a thickness of 0.0011 inch + or − 0.0002 inch. If the thickness of the foil is in excess of that specified, cracking of the silicon wafer parallel to and just above the interface of the silicon gold alloyed region occurs. On the other hand, if the thickness of the foil is less than that specified, complete melting is inhibited.

The cut gold-antimony foil disc and its associated silicon wafer are degreased in accordance with well known practices. Then they are thoroughly washed in preparation for the bonding operation which produces the improved back contact in accordance with this invention.

The wafer 10, as may be seen in FIGURE 1, is placed upon a lavite plate 20; the gold foil 21 is placed on top of the wafer 10 adjacent to the lapped surface 13 thereof. A second lavite plate 22 is then placed on top of the gold foil and a weight 23 is placed on top of plate 22 to provide a controlled pressure between the foil 21 and the wafer 10 during the bonding operation.

The lavite-wafer-foil-lavite sandwich is next placed in an oven which has an atmosphere of forming gas which preferably consists essentially of 85% nitrogen and 15% hydrogen. The sandwich is subjected to the following temperature cycle which also has been found to be of considerable importance in producing good ohmic or back contacts. The temperature is first brought up to approximately 450° C. as quickly as possible. As a gold-silicon eutectic forms at 370° C., it is apparent that at 450° C. alloying between the gold and the silicon takes place. The parts are allowed to remain at equilibrium for about five minutes to assure complete wetting of the gold foil.

The cooling cycle is now begun. The rate of cooling is maintained at not more than 12° C. per minute until a temperature of approximately 200° C. is reached, at which time the parts are removed from the oven. When the sandwich has cooled to room temperature the ohmic or back contact is now complete and the wafer is prepared for dicing into individual units on each of which a fused junction will be formed as explained in detail below. It will, of course, be understood, however, that the desirable characteristics resulting from the use of the above described process of producing a reliable low resistance ohmic contact may also find utility in the manufacture of devices other than the voltage sensitive capacitor described herein.

Figure 2:
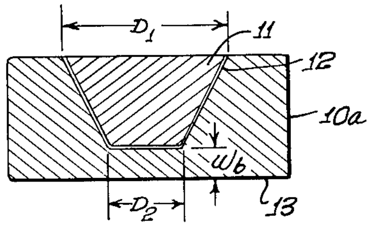
FIGURE 2 is a cross-sectional view of a voltage sensitive silicon crystal capacitor at an intermediate stage of its production.

Referring now to FIGURE 2, there is shown in cross section the main body member 10*a* from which an illustrative voltage sensitive silicon capacitor is to be produced. As noted above, the main body member 10*a* has been diced from the prepared silicon wafer 10 which is preferably of N-type single crystal material of a resistivity in the range from 0.1 to 1.5 ohm-centimeters in order to maximize the quality of the completed device. In accordance with the presently preferred illustrative embodiment of the invention, the main body member 10*a* is in the shape of a cylinder whose diameter is approximately 0.042 inch and whose thickness is 0.015 inch + or − 0.002 inch.

In order to produce the desired voltage-capacitance relationship, it is necessary to form a P-N junction in the main body member 10*a*. In accordance with the present invention, this junction is produced by alloying into the N-type conductivity body 10*a* a small quantity of aluminum as from a small wire about 10 mils in diameter and heating the body to a temperature of about 750° C. As a result, being in thermal equilibrium, the aluminum wire (not shown) in engagement with the body 10*a* alloys with the silicon to form a homogeneous mixture of aluminum and silicon. Upon cooling, there will be produced an alloy region 11 having a general frustro-conical shape within silicon body 10*a*. At the interface between the region 11 and body 10*a* there will be produced a regrown P-type conductivity region 12, thus establishing a P-N junction in the body. The frustro-conical shape of the region 11 is a natural result of the above described alloying procedure. The diameter $D_1$ of the top of region 11 has been found to be of critical importance. In particular, $D_1$ should be in the range from 10 to 30 mils for a device having the dimensions and properties herein described in connection with this illustrative embodiment. For devices having dimensions different than those hereinafter set forth, $D_1$ will, of course, vary over a different range which may be determined by one skilled in the art in the light of the present description.

While it has been found that for a body of the above described dimensions, the diameter $D_2$ of the lower surface of region 11 is determined by the diameter $D_1$ of the upper surface, none the less, the knowledge of the predicted range of $D_2$ (which is 6 mils + or − 3 mils) is helpful in controlling the production of the device. It follows from the above that the thickness, $W_b$, of the base region of the main body member 10*a* is also determined by the previously referred to parameters. This thickness $W_b$ should be limited to between 1 and 5 mils.

Figure 3:
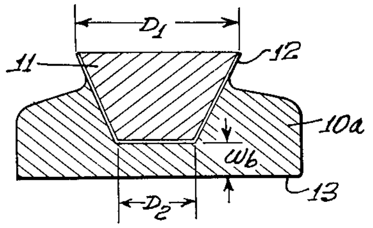
FIGURE 3 is a cross-sectional view of the device of FIGURE 2 at a later stage of its production.

The capacitance of the finished device is a function of the area of the P-N junction. Thus, the capacitance of the device can be decreased (and the Q of the device thereby increased) by decreasing this junction area. One method for reducing the junction area is to etch the entire main body member 10*a* after the junction has been formed by placing the body in a solution of one part hydrochloric acid and one part nitric acid for at least 10 seconds. This etch also serves to remove surface damage in the vicinity of the junction. Should the device be permitted to remain in the etch for longer than 10 seconds, there will be a selective erosion of the main body portion 10*a* without any erosion of the alloy region 11 which is impervious to the etch. Thus, the crystal will assume a shape as shown in FIGURE 3 in which region 11 will thus rise above the upper surface of the body 10*a*, thereby decreasing the junction area. Of course, the longer the device is left in the etch, the greater will be the exposure of region 11.

The device 10*a* shown in FIGURE 3 is encapsulated to form a construction of the type shown in FIGURE 4 in a manner which will be apparent to those skilled in the art. Thus, there is shown in FIGURE 4 a voltage sensitive silicon capacitor constructed in accordance with the present invention which is housed within a hermetically sealed package. The package shown herein is merely illustrative of one type which may be used. It consists of a central glass cylinder 25 to which are sealed metal tubes 26 and 27 having a thermal coefficient of expansion nearly equal to that of the glass cylinder 25. Tubes 26 and 27 have inserted therein metal pins 30 and 31, respectively. Spot welded to the ends of pins 30 and 31 are electrodes 32 and 33. The tubes 26 and 27 are welded to pins 30 and 31 to provide a hermetic seal. To the end 35 of pin 30 there is welded one end of a resilient whisker element 36 having its other end welded to the region 11 of the device 10*a*. The device 10*a* is bonded at surface 13 by means of solder 37 to end 38 of pin 31. A silastic coating 40 is also provided to protect the junction.

As noted above, the device of FIGURE 2 or 4 is a P-N junction semiconductor device suitable for use as a voltage variable capacitor. Devices of the type described in the above illustrative embodiment are found to be adequately described electrically from 5 to 500 megacycles by the above discussed equivalent circuit of a capacitor and a resistor in series. As noted above, the capacitance varies essentially inversely as the square root of the applied D.-C. bias voltage in the reverse direction and both the capacitance and resistance are virtually independent of operating frequency. Furthermore, each value of capacitance is nearly constant throughout the operating temperature range from −65° C. to 150° C. and the device affords a relatively high Q component. As noted above, the Q of the device is, of course, the ratio of the energy stored to the energy lost due to the series resistance. This series resistance is determined both by the resistivity of the body member 10*a* and by the resistance of the ohmic or back contact. Since, for a device of given geometry, a predetermined resistivity of the body 10*a* is necessary to achieve a desired capacitance, the improved Q of the present device having a given desired capacitance is primarily due to the improved manner of making the low resistance ohmic back contact.

Figure 5:
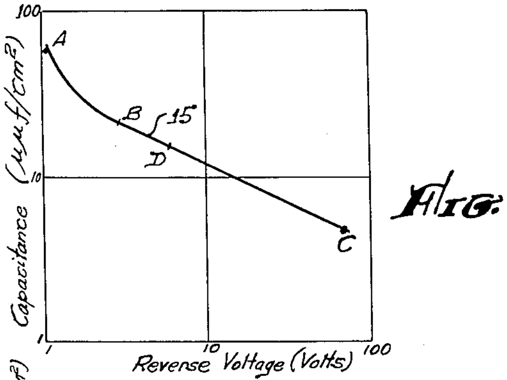
FIGURE 5 is a graph in which the capacitance of the device of FIGURE 4 in micromicrofarads per square centimeter is plotted as ordinate against the reverse bias voltage applied to the device as abscissa.

In FIGURE 5 there is shown a curve 15 which indicates the relationship of the log to the base 10 of capacitance in micromicrofarads per square centimeter of a device such as shown in FIGURES 2 and 4 as a function of the log to the base 10 of the amplitude of the reverse bias voltage in volts. This particular curve was plotted for a device produced in accordance with the present invention which was fabricated from a material having a resistivity of one ohm-centimeter. If the resistivity of the material be increased with all other parameters remaining constant, the curve 15 would move downwardly and vice versa. This particular device results in a substantially straight line relationship from point B to point C on curve 15 which points coincide with five volts and 80 volts, respectively. Below approximately five volts, a deviation from a straight line relationship is more apparent due to the effect of the "built-in" potential at the P-N junction. Further, beyond 80 volts, the device will break down. Thus, the operative range of the device may be said to be from 5 to 80 volts. It should be pointed out, however, that between points B and D some curvature still exists so that for a more nearly complete linear response, operation should be limited to the range between points D and C.

Figure 6:
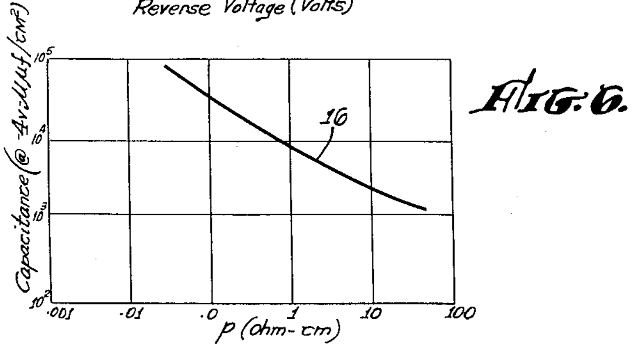
FIGURE 6 is a graph in which the capacitance of the device shown in FIGURE 4 in micromicrofarads per square centimeter is plotted as ordinate against the resistivity of the device in ohm-centimeters as abscissa.

In FIGURE 6, curve 16 shows how the log to the base 10 of the capacitance in micromicrofarads per square centimeter varies as a function of the log to the base 10 of the resistivity of the material used in making the device as measured in ohm-centimeters at an arbitrarily selected reverse bias voltage of four volts. The curve of FIGURE 6 thus shows one way to control the capacitance of the device (that is, to shift the curve of FIGURE 5 up or down), that is, by varying material resistivity.

As noted above, still another way to control capacitance is to vary the junction area. Of course, it will be realized that the amount by which the junction area can be varied in order to decrease capacitance and thereby increase the Q is limited not only by the desired capacitance but also by the fact that the power handling capacity of the device is in part determined by the junction area. On the other hand, an attempt to increase the Q of the device by controlling the resistivity of the material is limited as shown by the curves of FIGURES 5 and 6 insofar as for a device of a predetermined geometry, the desired capacitance for the device becomes a function of the resistivity of the material used.

Figure 7:
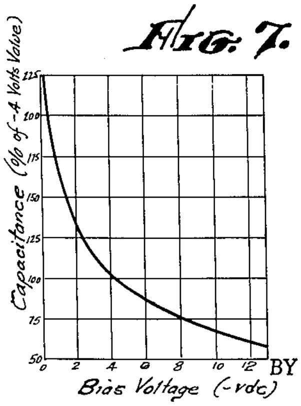
FIGURE 7 is a graph in which the bias voltage of a device such as shown in FIGURE 4 is plotted as abscissa against capacitance as a percentage of its value at −4 volts bias as ordinate.

One typical form of desired capacitance response is shown in FIGURE 7 which is a plot of bias voltage as abscissa against normalized capacitance (expressed as a percentage of its value at a bias voltage of −4 volts) as ordinate. It will be noted that the curve represents the above noted inverse square root relation, that is, that capacitance varies essentially as one over the square root of bias voltage. Typical values of attainable capacitances of one particular type of device at −4 volts bias in practical devices produced by the present invention range from 20 to 56 micromicrofarads. Of course, appropriate changes in parameters will permit different values as desired.

Figure 8:
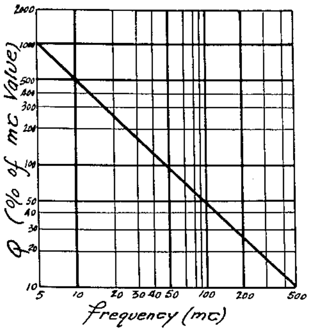
FIGURE 8 is a graph in which the normalized Q of a device such as shown in FIGURE 4 is plotted as ordinate against the frequency of the applied signal as abscissa.

In accordance with the present invention, a truly practical and effective improvement of the Q of the device, independent of the above noted limitations of the related capacitance determining parameters of dimensions and resistivity, is afforded by decreasing the series resistance due to the ohmic or back contact in accordance with the above noted manufacturing procedure. The resulting Q for the typical illustrative embodiment of the device as described in detail above is plotted in FIGURE 8 which is a normalized plot of the Q of the device versus the frequency of the applied operating signal. In FIGURE 8 the abscissa represents frequency in megacycles whereas the ordinate represents the Q expressed as a percentage of the value of Q at its 50 megacycle value. For a device such as that shown in FIGURE 4 constructed in accordance with the above specification and having a capacitance at a reverse bias voltage of —4 volts of 20 micromicrofarads, a typical value for the series resistance is approximately 8.5 ohms and a typical value for the Q at 50 megacycle frequency is approximately 18.7. If the above discussed parameters of the device are varied so as to produce a device which at a reverse bias voltage of —4 volts displays a capacitance of 56 micromicrofarads, it is found that the typical series resistance is reduced to 4.2 ohms whereas the typical value of Q at 50 megacycles is decreased to 13.5. These values may be controllably reproduced by the present manufacturing process to within a tolerance of not more than + or — 20% with a high yield quality. It will be noted that in the second example discussed above, the Q at 50 megacycles is decreased with respect to the first example even though the series resistance has also been decreased. This, of course, results from the deliberately intended increase in capacitance of the device. It should also be noted, however, that the overall level of Q at any given desired capacitance is, by the present invention, increased by reducing the contribution to the series resistance which has in the past resulted from inferior ohmic or back contacts.

While the principles of the invention have now been made clear, there will be immediately obvious to those skilled in the art many modifications in structure, arrangement, proportions, the elements and components of the invention and otherwise, which are particularly adapted for specific environments and operating requirements without departing from those principles. The appended claims are therefore intended to cover and embrace any such modifications within the limits only of the true spirit and scope of the invention.

In the claims:

1. In a silicon semiconductor device having a capacitance which is substantially independent of the frequency of the applied voltage which capacitance varies inversely as a function of the amplitude of the applied reverse voltage over a continuous range of from 5 to 80 volts, said characteristics of said device being controlled in manufacture to within a tolerance of 20% by: placing in contact with a body of N-type conductivity silicon whose resistivity is in the range from 0.1 to 1.5 ohm-centimeters a foil of 99% gold and 1% antimony, said foil having a thickness of 0.0011 plus or minus 0.0002 inch; quickly heating said body to a temperature of approximately 450° C.; retaining said body at said temperature for approximately five minutes; and cooling said body at a rate of not more than 12° C. per minute until a temperature of 200° C. is reached.

2. In a silicon semiconductor device having a capacitance which is substantially independent of the frequency of the applied voltage which capacitance varies inversely as a function of the amplitude of the applied reverse voltage over a continuous range of at least 10 volts, said characteristics of said device being controlled in manufacture to within a tolerance of 20% by: wet lapping a first surface of an N-type conductivity silicon wafer which had previously been lapped and etched after slicing, said silicon wafer having a resistivity in the range from 0.1 to 1.5 ohm-centimeters; placing a foil of 99% gold and 1% antimony foil over said first surface of said wafer said foil having a thickness of 0.0011 plus or minus 0.0002 inch; quickly heating the wafer-foil sandwich to a temperature of approximately 450° C. in a forming gas atmosphere, said gas consisting essentially of 85% nitrogen and 15% hydrogen; retaining said sandwich at said temperature for approximately 5 minutes; and cooling said sandwich at a rate of not more than 12° C. per minute until a temperature of 200° C. is reached.

3. A silicon semiconductor alloy junction device having a capacitance which is substantially independent of the frequency of the applied voltage which capacitance varies inversely as the square root of the amplitude of the applied reverse voltage over a continuous range of at least 10 volts, said characteristics of said device being controlled in manufacture by: wet lapping a first surface of an N-type conductivity silicon wafer which had previously been lapped and etched after slicing, said silicon wafer having a resistivity in the range from 0.1 to 1.5 ohm-centimeters; placing a sheet of 99% gold and 1% antimony foil over said first surface of said wafer, said foil having a thickness of 0.0011 plus or minus 0.0002 inch; quickly heating the wafer and foil to a temperature of approximately 450° C. in a forming gas atmosphere, said gas consisting essentially of 85% nitrogen and 15% hydrogen, whereby said foil is alloyed in said first surface; retaining said wafer at said temperature for approximately 5 minutes; cooling said wafer at a rate of not more than 12° C. per minute until a temperature of 200° C. is reached; cutting said wafer into a plurality of substantially cylindrical dice of a diameter of approximately 0.042 inch and a height of 0.015 inch+0.003 inch; and alloying a small mass of aluminum into the face of said dice having a substantially frusto-conical cross section with the diameter of the upper surface of said alloyed region being approximately 0.020 inch, the distance between the foil alloyed surface of said dice and the bottom surface of said alloyed region being in the range from 0.001 inch to 0.005 inch.

4. A high Q voltage sensitive variable capacitor comprising: a silicon semiconductor diode having a predetermined capacitance which is substantially independent of the frequency of the applied signal voltage and which varies inversely as a function of the amplitude of the applied reverse bias voltage over a continuous range of at least 10 volts, said predetermined capacitance varying within a range of values between 10 and 250 micromicrofarads, said diode having a predetermined Q defined by the ratio of energy stored to energy lost in said diode having a value of at least 10 to 1, said predetermined characteristics being controllably reproducible to within a tolerance of not more than 20%, said diode comprising a cylindrical semiconductor body member composed of silicon of a first conductivity type and having a resistivity in the range from 0.1 to 1.5 ohm-centimeters, said cylindrical body member having a diameter of approximately 0.042 inch and a thickness of approximately 0.015 inch, a frusto-conical aluminum alloyed region in a first end of said cylindrical body member, the surface of said alloyed region at said first end of said body member having a diameter in the range of 10 to 30 mils, a regrown region of the opposite conductivity type from that of the material of said body member formed at the interface between said alloyed region and said body member thereby establishing a fused junction in said body member, a base region between the second end of said cylindrical body member and said frusto-conical alloyed region, a first electrical contact welded to said alloyed region, and an ohmic back contact to said base region on said second end of said cylindrical body member, said ohmic back contact comprising a 99% gold and 1% antimony foil having a thickness in the range of 0.0011 inch plus or minus 0.0002 inch alloyed under heat and pressure to a wet-lapped surface of said second end of said body member.

5. A high Q voltage sensitive variable capacitor comprising a silicon diode having a predetermined capacitance which is substantially independent of the frequency of the applied signal voltage and which varies inversely as a function of the amplitude of the applied reverse bias voltage over a continuous range of at least 10 volts, said predetermined capacitance varying within a range of values lying between 10 and 250 micro-microfarads, said device having a predetermined Q defined by the ratio of energy stored to energy lost of a value of at least 10 to 1, said predetermined characteristics being controllably reproducible in manufacture of said device to within a tolerance of not more than 20%, said device comprising a body member composed of silicon of a first conductivity type and having a resistivity in the range from 0.1 to 1.5 ohm-centimeters, an aluminum alloyed region in a first end of said body member, a regrown region of the opposite conductivity type from that of the material of said body member formed at the interface between said alloyed region and said body member thereby establishing a fused junction in said body member, a base region between the second end of said body member and said alloyed region, a first electrical contact welded to said alloyed region, and an ohmic back contact to said base region, said ohmic back contact comprising a 99% gold and 1% antimony foil having a thickness in the range of 0.0011 inch plus or minus 0.0002 inch alloyed under heat and pressure to a wet-lapped surface of said base region.

6. A high Q voltage sensitive variable capacitor comprising: a silicon semiconductor diode having a predetermined capacitance which is substantially independent of the frequency of the applied signal voltage and which varies inversely as a function of the amplitude of the applied reverse biased voltage over a continuous range of at least 10 volts, said predetermined capacitance varying within a range of values between 10 and 250 micro-microfarads, said diode having a predetermined Q defined by the ratio of energy stored to energy lost in said diode of a value of at least 10 to 1, said predetermined characteristics being controllably reproducible in manufacture to within a tolerance of not more than 20%, said diode comprising a cylindrical semiconductor body member composed of silicon of N-type conductivity and having a resistivity in the range from 0.1 to 1.5 ohm-centimeters, said cylindrical body member having a diameter of approximately 0.042 inch and a thickness of approximately 0.015 inch, a frustro-conical aluminum alloyed region in a first end of said cylindrical body member, the surface of said alloyed region at said first end of said body member having a diameter in the range of 10 to 30 mils, the smallest cross sectional diameter of said frustro-conical region in said body member being in the range of 3 to 9 mils, a regrown region of P-type conductivity formed at the interface between said alloyed region and said body member thereby establishing a fused junction in said body member, a base region between the second end of said cylindrical body member and said frustro-conical alloyed region, said base region having a thickness in the range of 1 to 5 mils, a resilient whisker element welded in electrical contact to said alloyed region, and an ohmic back contact to said base region on said second end of said cylindrical body member, said ohmic back contact comprising a 99% gold and 1% antimony foil having a thickness in the range of 0.0011 inch plus or minus 0.0002 inch alloyed under heat and pressure in a forming atmosphere consisting essentially of 85% nitrogen and 15% hydrogen to a wet-lapped surface of said base region.

7. The method of forming an ohmic contact to a silicon wafer comprising the steps of forming said wafer into a desired shape, etching a first surface of said wafer, wet-lapping said first surface of said wafer with an abrasive to roughen said etched surface, placing a sheet of 99% gold and 1% antimony foil in pressure contact over said first surface of said wafer, said foil having a thickness of 0.0011 plus or minus 0.0002 inch, quickly heating the wafer and the foil to a temperature of approximately 450° C. in a forming gas atmosphere, said gas consisting essentially of 85% nitrogen and 15% hydrogen, whereby said foil is alloyed with said first surface, retaining said wafer at said temperature for approximately five minutes, cooling said wafer at a rate of not more than 12° C. per minute until a temperature of 200° C. is reached, and thereafter cooling said wafer and contact to room temperature.

8. The method of producing a silicon semiconductor device having a capacitance which is substantially independent of the frequency of the applied signal voltage and which capacitance varies inversely as a function of the amplitude of the applied reverse bias voltage over a continuous range of from five to eighty volts and having a Q of at least 10, said characteristics of said device being controlled in manufacture to within a tolerance of not more than 20%, said method comprising the steps of: placing in pressure contact with a body of N-type conductivity silicon whose resistivity is in the range of 0.1 to 1.5 ohm-centimeters a foil of 99% gold and 1% antimony, said foil having a thickness of 0.0011 plus or minus 0.0002 inch, quickly heating said body to a temperature of approximately 450° C., retaining said body at said temperature for approximately five minutes, cooling said body at a rate of not more than 12° C. per minute until a temperature of 200° C. is reached, further cooling said body to room temperature, and producing a fused junction within said body.

9. The method of manufacturing a silicon semiconductor alloy junction device having a capacitance which is substantially independent of the frequency of the applied signal voltage and which varies inversely as the square root of the amplitude of the applied reverse bias voltage over a continuous range of at least 10 volts and having a Q of a value of at least 10, said method comprising the steps of slicing and etching a silicon wafer, said silicon wafer having a resistivity in the range from 0.1 to 1.5 ohm-centimeters and being of N-type conductivity, wet-lapping a first surface of said etched wafer with an abrasive to roughen said surface, placing a foil of 99% gold and 1% antimony foil under pressure over said first roughened surface of said wafer, said foil having a thickness of 0.0011 plus or minus 0.0002 inch, quickly heating said wafer and said foil to a temperature of approximately 450° C. in a forming gas atmosphere, said gas consisting essentially of 85% nitrogen and 15% hydrogen, whereby said foil is alloyed in said first surface; retaining said wafer at said temperature for approximately five minutes, cooling said wafer at a rate of not more than 12° C. per minute until a temperature of 200° C. is reached, cutting said wafer into a plurality of substantially cylindrical dice of a diameter of approximately 0.042 inch and a height of 0.015 inch, and alloying a small mass of aluminum into the face of said dice to form a region having a substantially frustro-conical cross section with the diameter of the upper surface of said alloyed region being approximately 0.020 inch, the distance between the foil alloyed surface of said dice and the bottom of said alloyed region being in the range from 0.001 inch to 0.005 inch.

10. In a silicon semiconductor device having a capacitance which is substantially independent of the frequency of the applied voltage which capacitance varies inversely as a function of the amplitude of the applied reverse voltage over a continuous range of at least 10 volts, said characteristics of said device being controlled in manufacture to within a tolerance of 20% by: wet lapping a first surface of an N-type conductivity silicon wafer which had previously been lapped and etched after slicing, said silicon wafer having a resistivity in the range from 0.1 to 1.5 ohm-centimeters; placing a sheet of 99% gold and 1% antimony foil over said first surface of said wafer, said sheet having a thickness of 0.0011 plus or minus 0.0002″; quickly heating said body to a temperature of approximately 450° C.; retaining said body at said temperature for approximately five minutes; and cooling said body at a rate of not more than 12° C. per minute until a temperature of 200° C. is reached.

References Cited in the file of this patent

UNITED STATES PATENTS

| | | |
|---|---|---|
| 2,577,803 | Pfann | Dec. 11, 1951 |
| 2,736,847 | Barnes | Feb. 28, 1956 |
| 2,757,324 | Pearson | July 31, 1956 |
| 2,840,770 | Jackson | June 24, 1958 |